United States Patent [19]
Lien

[11] Patent Number: 5,729,419
[45] Date of Patent: Mar. 17, 1998

[54] CHANGED DEVICE MODEL ELECTROSTATIC DISCHARGE PROTECTION CIRCUIT FOR OUTPUT DRIVERS AND METHOD OF IMPLEMENTING SAME

[75] Inventor: Chuen-Der Lien, Los Altos Hills, Calif.

[73] Assignee: Integrated Device Technology, Inc., Santa Clara, Calif.

[21] Appl. No.: 560,608

[22] Filed: Nov. 20, 1995

[51] Int. Cl.$^6$ .................................................. H02H 9/00
[52] U.S. Cl. ............................ 361/111; 361/56; 361/119
[58] Field of Search .......................... 361/56, 111, 58, 361/115, 91, 118, 119

[56] References Cited

U.S. PATENT DOCUMENTS

| | | | |
|---|---|---|---|
| 4,456,939 | 6/1984 | Ozaki et al. | 361/56 |
| 4,481,521 | 11/1984 | Okumura | 357/23 |
| 4,678,950 | 7/1987 | Mitake | 307/550 |
| 4,692,834 | 9/1987 | Iwahashi et al. | 361/91 |
| 4,739,438 | 4/1988 | Sato | 361/91 |
| 4,868,705 | 9/1989 | Shiochi et al. | 361/91 |
| 5,019,883 | 5/1991 | Mori et al. | 357/23 |
| 5,157,571 | 10/1992 | Gotz | 361/54 |
| 5,208,719 | 5/1993 | Wei | 361/56 |
| 5,218,222 | 6/1993 | Roberts | 257/362 |
| 5,287,241 | 2/1994 | Puar | 361/56 |
| 5,301,081 | 4/1994 | Podell et al. | 361/56 |
| 5,333,093 | 7/1994 | Krautschneider | 361/56 |
| 5,345,356 | 9/1994 | Pianka | 361/56 |
| 5,379,175 | 1/1995 | Masaki | 361/56 |

*Primary Examiner*—Jeffrey A. Gaffin
*Assistant Examiner*—Stephen Jackson
*Attorney, Agent, or Firm*—Skjerven, Morrill, MacPherson, Franklin & Friel

[57] ABSTRACT

An output circuit for an integrated circuit which provides protection for the integrated circuit during a charged device model (CDM) electrostatic discharge (ESD) event. The output circuit includes a first FET connected across a first voltage supply rail ($V_{CC}$ or ground) and an output pad. A first driving circuit drives the gate of the first transistor. One or more CDM ESD protection circuits are connected between the gate of the first transistor and the output pad. These protection circuits provide relatively low impedance current paths which minimize current flow through the gate oxide layer of the first FET during a CDM ESD event.

26 Claims, 5 Drawing Sheets

CHANGED DEVICE MODEL ELECTROSTATIC DISCHARGE PROTECTION CIRCUIT FOR OUTPUT DRIVERS AND METHOD OF IMPLEMENTING SAME

FIELD OF THE INVENTION

This invention relates to a semiconductor structure which provides electrostatic discharge protection for an integrated circuit. More specifically, the invention relates to a semiconductor structure which protects an integrated circuit during conditions encountered during charged device model testing.

BACKGROUND OF THE INVENTION

Integrated circuits (ICs) are generally susceptible to damage from electrostatic discharge (ESD) events. An ESD event typically occurs when an IC is handled by human beings or by machines. During the ESD event, a large voltage is applied to the IC. To avoid damage to the IC during an ESD event, ESD protection devices are typically fabricated on the IC and connected to the pads and other internal nodes of the IC. The ESD protection devices provide discharge paths so that the internal circuits of the IC are not damaged during the ESD event.

Different ESD tests are used to evaluate the effectiveness of ESD protection devices. Three ESD tests used include: a human body model (HBM) test, a machine model (MM) test and a charged device model (CDM) test. Different ESD protection devices may be needed to optimize the level of ESD protection provided for the different ESD tests.

During a CDM ESD test, the device to be tested is charged. Most of this charge is stored in the $V_{CC}$ voltage supply rail and/or the ground supply rail within the device. One of the pads of the charged device is then connected to an external ground. The charges stored in the $V_{CC}$ supply rail and/or the ground supply rail must find paths flowing to the pad under test.

FIG. 1a is a schematic diagram of a conventional output circuit 100 of an IC without CDM ESD protection. Output circuit 100 includes n-channel transistors 102 and 103, which have sources connected to the $V_{CC}$ and ground supply rails, respectively, drains connected to output pad 101, and gates connected to output drivers 104 and 105, respectively. During a CDM ESD event, charges stored in the $V_{CC}$ supply rail are discharged as currents $I_1$, $I_3$ and $I_5$ to output pad 101. Charges stored in the ground supply rail are discharged as currents $I_2$, $I_4$ and $I_6$ to output pad 101. Normally, currents $I_1$ and $I_2$ will not cause damage to circuit 100 since these currents do not travel through any gate oxide layers. However, currents $I_3$ and $I_5$ can cause damage to the gate oxide of transistor 102 and currents $I_4$ and $I_6$ can cause damage to the gate oxide of transistor 103.

To minimize CDM ESD damage, resistors 107–108 and ESD protection devices 111–114 can be added to circuit 100 as shown in FIG. 1b. Resistors 107–108 reduce the magnitude of currents $I_3$–$I_6$ by placing higher impedances along the paths of these currents. ESD protection devices 111–114 divert a portion of currents $I_3$–$I_6$ to the $V_{CC}$ and/or ground supply rails, thereby reducing the current flowing through the gate oxide of transistors 102 and 103. For example, ESD protection device 111 diverts a portion of current $I_3$ through the $V_{CC}$ supply rail and transistor 102 to output pad 101. This diverted current is labeled as current $I_{3a}$. The portion of current $I_3$ which is not diverted by ESD protection device 111 is labeled as current $I_{3b}$. This protection scheme assumes that the preferred current path is through ESD devices 111–114, to the $V_{CC}$ and/or ground supply rails and then through transistors 102–103 to output pad 101, rather than through the gate oxide of transistors 102–103. This assumption is generally, but not always, valid. As a result, ESD protection devices 111–114 are not always effective to protect the gate oxide of transistors 102 and 103.

FIG. 2 is a schematic diagram of a conventional input circuit 200 of an IC which includes input pad 201, HBM ESD protection devices 202 and 203, CDM ESD protection devices 204 and 205, resistor 206 and input driver 210. Input driver 210 includes p-channel transistor 211 and n-channel transistor 212. During a CDM ESD event, CDM ESD devices 204 and 205 provide current discharge paths between the $V_{CC}$ and ground supply rails and input pad 201. In this manner, CDM ESD protection devices 204 reduce CDM ESD current flow through the gate oxide of transistors 211 and 212.

Although input circuits of ICs have been provided with effective CDM ESD protection circuits, the same is not true for output circuits of ICs. It would therefore be desirable to have a CDM ESD protection circuit which is effective to protect the gate oxide of transistors used in output driver circuits.

SUMMARY

Accordingly, the present invention provides an output circuit for an integrated circuit which provides protection during CDM ESD events. In one embodiment, the output circuit includes an output pad, a first voltage supply rail for receiving a first voltage during normal operation of the integrated circuit, and a second voltage supply rail for receiving a second voltage during normal operation of the integrated circuit. A first field effect transistor is connected between the first voltage supply rail and the output pad. A first driving circuit, which is connected across the first and second voltage supply rails, is connected to drive the gate of the first transistor.

A first ESD protection circuit is connected between the gate of the first transistor and the output pad. The first ESD protection circuit provides relatively low impedance current path from the gate of the first transistor to the output pad during a CDM ESD event. This current path is connected in parallel with the gate oxide layer of the first transistor. As a result, minimal current, if any, passes through the gate oxide of the first transistor during a CDM ESD event.

In one embodiment, the first voltage supply rail is a $V_{CC}$ voltage supply rail, such that the first transistor and the first driving circuit form a pull-up driver circuit. In another embodiment, the first voltage supply rail is a ground voltage supply rail, such that the first transistor and the first driving circuit form a pull-down driver circuit.

In another embodiment, the output circuit includes a second field effect transistor connected between the second voltage supply rail and the output pad. A second driving circuit, which is connected across the first and second voltage supply rails, is connected to drive the gate of the second transistor. In addition, a second ESD protection circuit is connected between the gate of the second transistor and the output pad. During a CDM ESD event, the second ESD protection circuit provides a low impedance path between the gate of the second transistor and the output pad. As a result, minimal current, if any, passes through the gate oxide of the second transistor during a CDM ESD event.

In one variation, the output circuit can also include a first resistor connected between the first driving circuit and the gate of the first transistor. The first resistor increases the impedance of the current path which includes the gate oxide of the first transistor. As a result, the CDM ESD current through the gate oxide of the first transistor is further reduced.

In another variation, the output circuit includes a plurality of ESD protection circuits connected in parallel between the gate of the first transistor and the output pad. By connecting a plurality of ESD protection circuits in parallel, the equivalent impedance of these protection circuits is reduced. As a result, more CDM ESD current will flow through these protection circuits.

The ESD protection circuits can include, for example, an n-channel field effect transistor having a gate connected to a ground voltage supply rail, or a p-channel field effect transistor having a gate connected to a $V_{CC}$ voltage supply rail.

The present invention also includes a method of protecting an output circuit of an integrated circuit. In connection with the output circuitry described above, this method includes the steps of: (1) providing a first protection circuit between the gate of the first transistor and the output pad, (2) routing current from the first supply rail to the output pad through the first protection circuit when excessive charge is stored in the first supply rail, and (3) routing current from the second supply rail to the output pad through the first protection circuit when excessive charge is stored in the second supply rail.

The present invention will be more fully understood in light of the following detailed description taken together with the drawings.

BRIEF DESCRIPTION OF THE DRAWINGS

FIG. 3b is a schematic diagram illustrating current paths between the ground supply rail and the output pad in the output circuit of FIG. 3a;

DETAILED DESCRIPTION

Figure 3A:
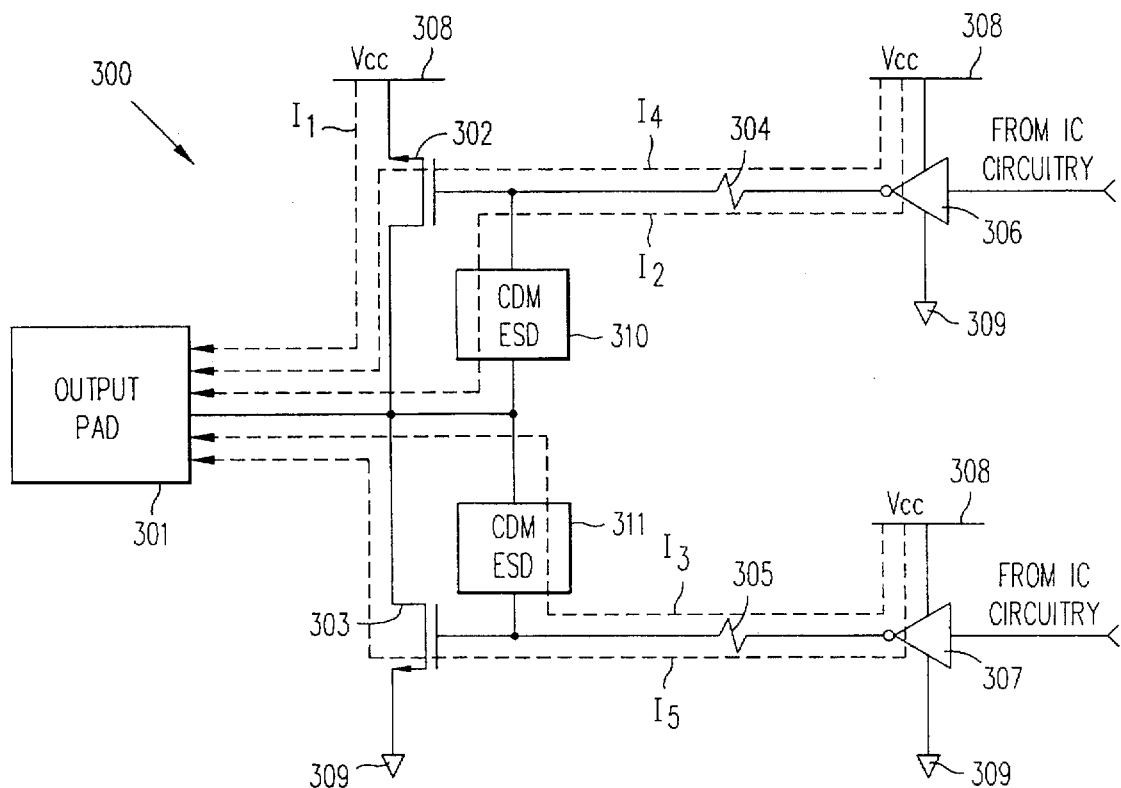
FIG. 3a is a schematic diagram of an output circuit of an IC in accordance with one embodiment of the invention.

FIG. 3a is a schematic diagram of output circuit 300 of an IC in accordance with one embodiment of the invention. Output circuit 300 includes output pad 301, n-channel field effect transistors 302 and 303, resistors 304 and 305, inverters 306 and 307, $V_{CC}$ voltage supply rail 308, ground voltage supply rail 309 and CDM ESD protection circuits 310 and 311.

NMOS transistor 302 has a source connected to $V_{CC}$ supply rail 308 and a drain connected to output pad 301. The gate of transistor 302 is connected to the output terminal of inverter 306 through resistor 304. Inverter 306 is a conventional device which is connected across $V_{CC}$ supply rail 308 and ground supply rail 309. NMOS transistor 303 has a source connected to ground supply rail 309 and a drain connected to output pad 301. The gate of transistor 303 is connected to the output terminal of inverter 307 through resistor 305. Inverter 307 is connected across $V_{CC}$ supply rail 308 and ground supply rail 309. The input terminals of inverters 306 and 307 are connected to other circuitry of the IC (not shown). During normal operation of the IC, inverters 306 and 307 provide signals to the gates of transistors 302 and 303, thereby selectively coupling output pad 301 to either $V_{CC}$ supply rail 308 or ground supply rail 309.

CDM ESD protection circuit 310 is connected between the gate of transistor 302 and output pad 301. Similarly, CDM ESD protection circuit 311 is connected between the gate of transistor 303 and output pad 301.

During a CDM ESD event, the charge stored in $V_{CC}$ supply rail 308 is discharged from $V_{CC}$ supply rail 308 to output pad 301 along one or more of the following current paths. A first current path between $V_{CC}$ supply rail 308 and output pad 301, labeled $I_1$, exists from the source to the drain of transistor 302. A second current path between $V_{CC}$ supply rail 308 and output pad 301, labeled $I_2$, exists through inverter 306, resistor 304 and CDM ESD protection circuit 310. A third current path, labeled $I_3$, is provided from $V_{CC}$ supply rail 308 to output pad 301 through inverter 307, resistor 305 and CDM ESD protection circuit 311. A fourth possible current path, labeled $I_4$, exists from $V_{CC}$ supply rail 308 to output pad 301 through inverter 306, resistor 304 and the gate oxide of transistor 302. A fifth possible current path, labeled $I_5$, exists from $V_{CC}$ supply rail 308 to output pad 301 through inverter 307, resistor 305 and the gate oxide of transistor 303. Resistor 304 increases the impedance of current paths $I_2$ and $I_4$, and resistor 305 increases the impedance of current paths $I_3$ and $I_5$. In one embodiment, each of resistors 304 and 305 has an impedance in the range of 0 to a few k$\Omega$. In other embodiments, resistors 304 and 305 can have other impedances as determined by one skilled in the art. Resistors 304 and 305 advantageously shift more current to the first current path $I_1$. Current flowing along current path $I_1$ during a CDM ESD event is unlikely to damage transistor 302.

CDM ESD protection circuit 310, which lies along the second current path $I_2$, routes charge from the gate of transistor 302 to output pad 301. As a result, only minimal current, if any, will flow along the fourth current path $I_4$. Typically, charge densities of a few coulombs/cm$^2$ or more can cause damage to the gate oxide of transistor 302. By reducing the current flow along current path $I_4$, the current flow through the gate oxide of transistor 302 is reduced. As a result, the likelihood of ESD damage to transistor 302 is reduced.

Similarly, CDM ESD protection circuit 311, which lies along the third current path $I_3$, routes charge from the gate of transistor 303 to output pad 301. As a result, only minimal current, if any, will flow along the fifth current path $I_5$. By reducing the current flow along current path $I_5$, the current flow through the gate oxide of transistor 303 is reduced. As a result, the likelihood of ESD damage to transistor 303 is reduced.

Figure 1A:
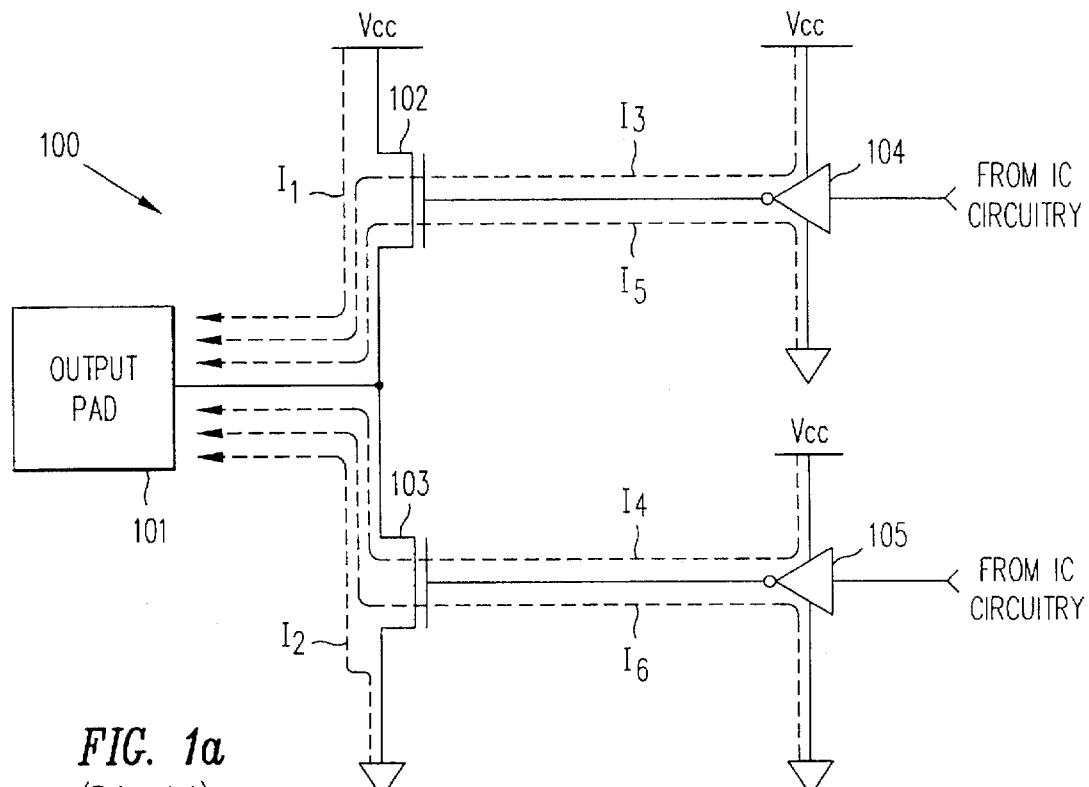
FIG. 1a is a schematic diagram of a conventional output circuit without CDM ESD protection.
Figure 1B:
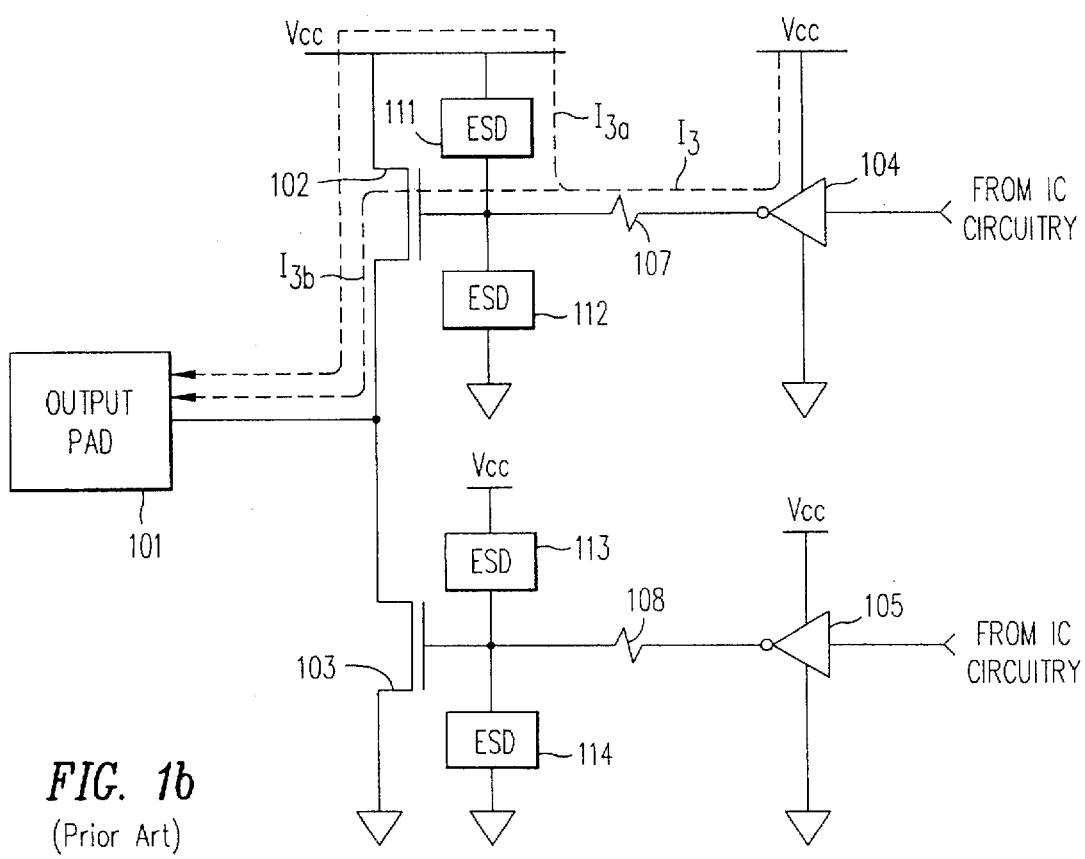
FIG. 1b is a schematic diagram of the output circuit of FIG. 1a with conventional ESD protection circuitry.
Figure 2:
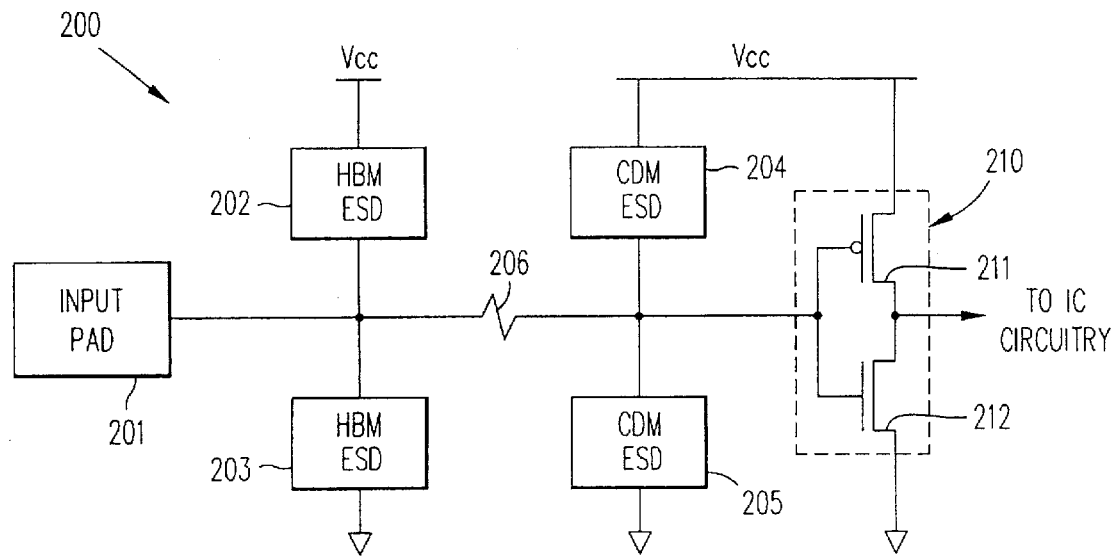
FIG. 2 is a schematic diagram of a conventional input circuit with conventional ESD protection circuitry.

A comparison between prior art ESD protection device 111 (FIG. 1b) and CDM ESD protection circuit 310 shows that CDM ESD protection circuit 310 more effectively protects the gate oxide of transistor 302. CDM ESD protection circuit 310 provides a path from the gate of transistor 302 to output pad 301 through protection device 310 only (see, current path $I_2$ in FIG. 3a). In contrast, ESD protection device 111 provides a path from the gate of transistor 102 to output pad 101 through ESD protection device 111 and transistor 102 (see, current path $I_{3a}$ in FIG. 1b). Thus, ESD protection device 310 provides a current path between the gate of transistor 302 and output pad 301 which has a lower impedance than the current path provided by ESD protection device 111. As a result, ESD protection device 310 is more effective at diverting CDM ESD current away from the gate oxide of transistor 302.

Figure 3B:
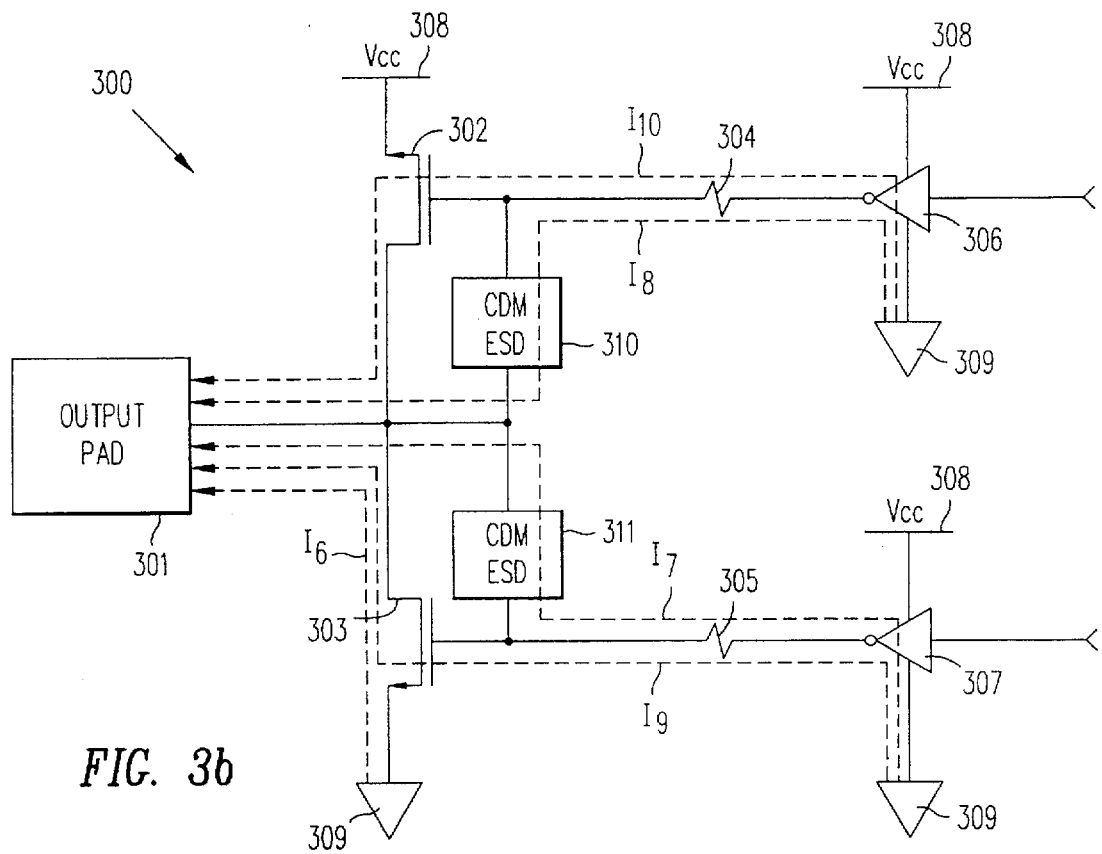

Similar current paths exist between ground supply rail 309 and output pad 301 which allow for discharge from ground supply rail 309 to output pad 301 during a CDM ESD event. FIG. 3b is a schematic diagram illustrating the current paths between ground supply rail 309 and output pad 301 in output circuit 300. Current path $I_6$ exists from the source to the drain of transistor 303. Current path $I_7$ exists from ground supply rail 309 to output pad 301 through resistor 305 and CDM ESD protection circuit 311. Current path $I_8$ exists through resistor 304 and CDM ESD protection circuit 310. Current path $I_9$ exists through resistor 305 and the gate oxide of transistor 303. Current path $I_{10}$ exists through resistor 304 and the gate oxide of transistor 302. During a CDM ESD event across output pad 301 and ground supply rail 309, CDM ESD protection circuits 310 and 311 operate in the manner previously described to provide low impedance paths between the respective gates of transistors 302 and 303 and output pad 301, thereby reducing current flow on current paths $I_9$ and $I_{10}$.

Figure 4:
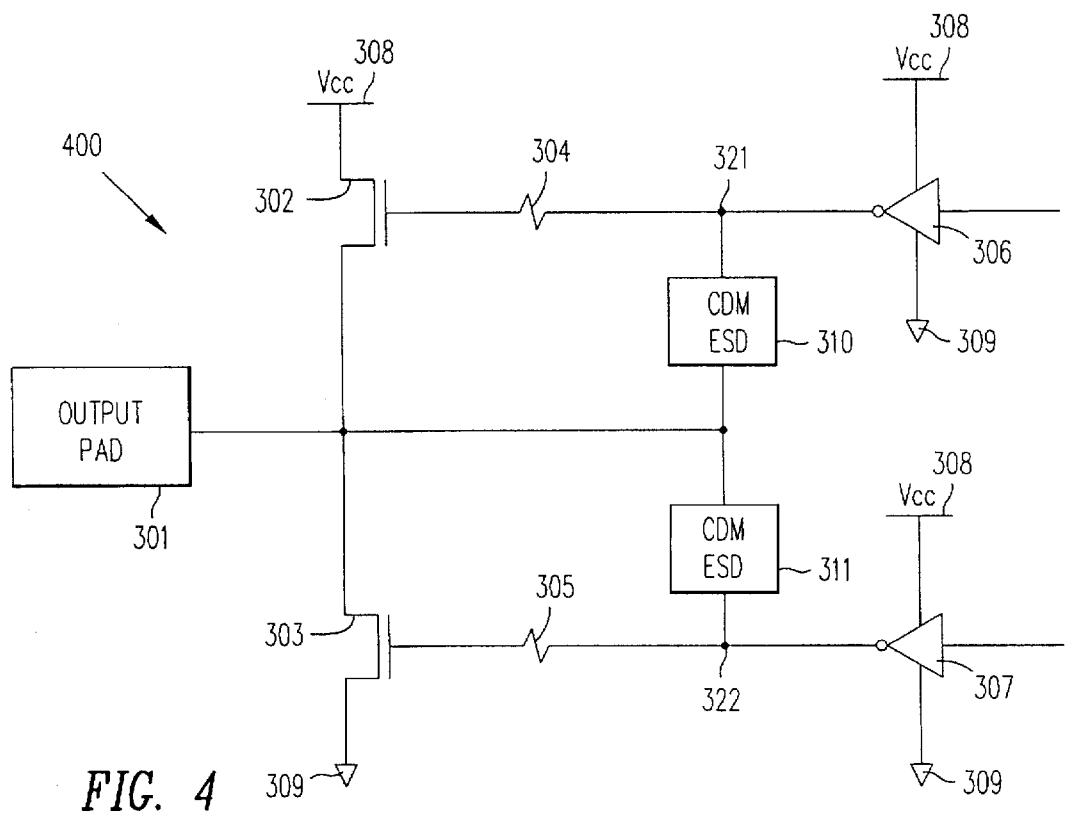
FIG. 4 is a schematic diagram of an output circuit of an IC in accordance with another embodiment of the invention.

FIG. 4 is a schematic diagram of output circuit 400 of an IC in accordance with another embodiment of the invention. Because output circuit 400 is similar to output circuit 300 (FIGS. 3a–3b), similar elements of these output circuits 300, 400 are labeled with similar reference numbers. Output circuit 400 differs from output circuit 300 in that resistor 304 of output circuit 400 is connected between the gate of NMOS transistor 302 and the tap point 321 of CDM ESD protection circuit 310, and in that resistor 305 of output circuit 400 is connected the gate of NMOS transistor 303 and the tap point 322 of CDM ESD protection circuit 311. This configuration advantageously maintains the high impedance of the current paths which pass through the gate oxide of transistors 302 and 303, while reducing the impedances of the current paths which pass through CDM ESD protection circuits 310–311. Output circuit 400 operates in a manner similar to output circuit 300. That is, CDM ESD current is routed through CDM ESD protection circuits 310 and 311, thereby reducing current flow through the gate oxide of transistors 302 and 303.

Figure 5:
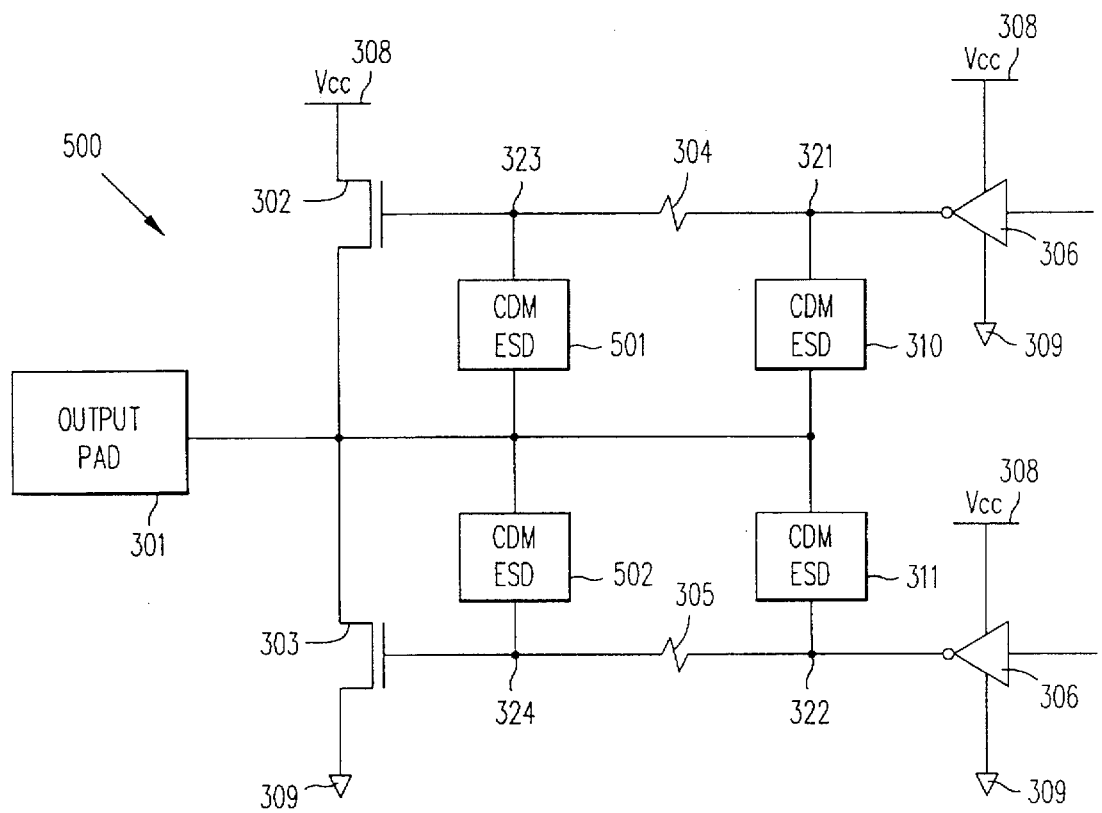
FIG. 5 is a schematic diagram of an output circuit of an IC in accordance with another embodiment of the invention.

FIG. 5 is a schematic diagram of output circuit 500 of an IC in accordance with another embodiment of the invention. Because output circuit 500 is similar to output circuit 400 (FIG. 4), similar elements of these output circuits 400, 500 are labeled with similar reference numbers. Output circuit 500 differs from output circuit 400 in that output circuit 500 includes two additional CDM ESD protection circuits 501 and 502. CDM ESD protection circuit 501 has one terminal connected between resistor 304 and the gate of transistor 302 at tap point 323, and another terminal connected to output pad 301. CDM ESD protection circuit 502 has a terminal connected between resistor 305 and the gate of transistor 303 at tap point 324, and another terminal connected to output pad 301. Thus, CDM ESD protection circuit 501 is connected in parallel with CDM ESD protection circuit 310 and CDM ESD protection circuit 502 is connected in parallel with CDM ESD protection circuit 311. Parallel CDM ESD protection circuits 310 and 501 provide a reduced impedance path between the gate of transistor 302 and output pad 301. Similarly, parallel CDM ESD protection circuits 311 and 502 provide a reduced impedance path between the gate of transistor 303 and output pad 301. As a result, more CDM ESD current flows through CDM ESD protection circuits 310, 311, 501 and 502, and less CDM ESD current flows through the gate oxide of transistors 302 and 303.

Although two CDM ESD protection circuits 310 and 501 are illustrated in parallel between output pad 301 and the gate of transistor 302, and two CDM ESD protection circuits 311 and 502 are illustrated in parallel between output pad 301 and the gate of transistor 303, other numbers of parallel protection circuits can be used and are considered within the scope of the invention. Moreover, resistors 304 and 305 can be located at various positions along the lines which extend from transistors 302 and 303 to inverters 306 and 307. For example, resistor 304 can be located between the gate of transistor 302 and the tap point 323 of CDM ESD protection circuit 501, or between the tap point 321 of CDM ESD protection circuit 310 and inverter 306.

In each of FIGS. 3a, 3b, 4 and 5, the various output circuits illustrated include output pads which have both pull-up and pull-down driver circuits. (The upper half of each of FIGS. 3a, 3b, 4 and 5 includes a pull-up driver circuit and the lower half of each of these figures includes a pull-down driver circuit.) However, the output circuits previously described can be modified such that the output pads are connected to a pull-up driver circuit only, or to a pull-down driver circuit only. To create such output circuits, the previously described output circuits (FIGS. 3a, 3b, 4 and 5) are split in half.

Figure 6A:
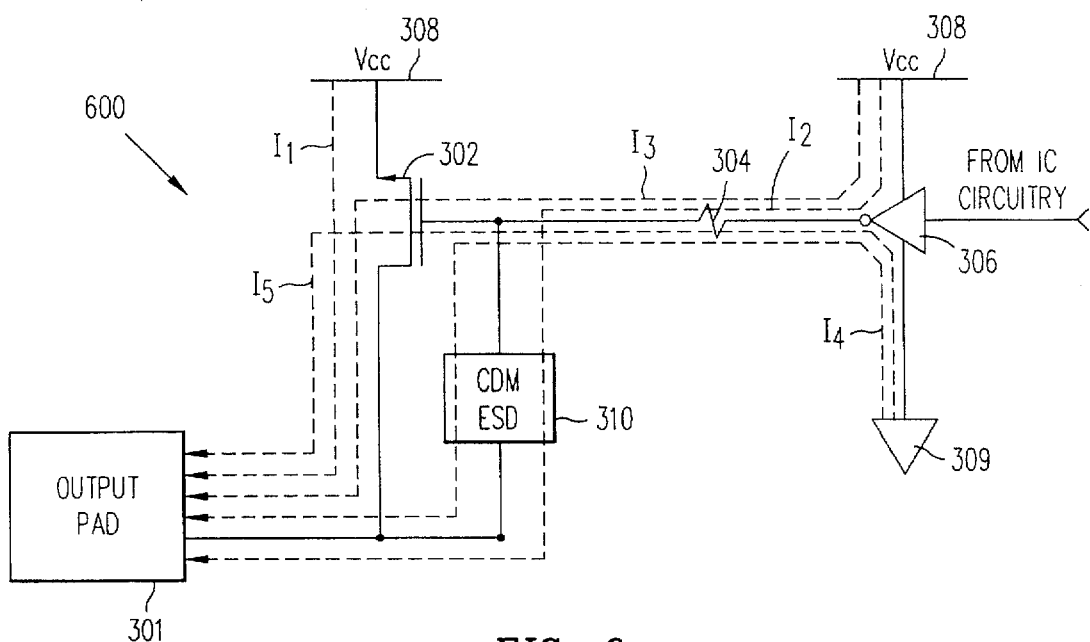
FIGS. 6a and 6b are schematic diagrams of output circuits for a pull-up driver circuit and a pull-down driver circuit, respectively.
Figure 6B:
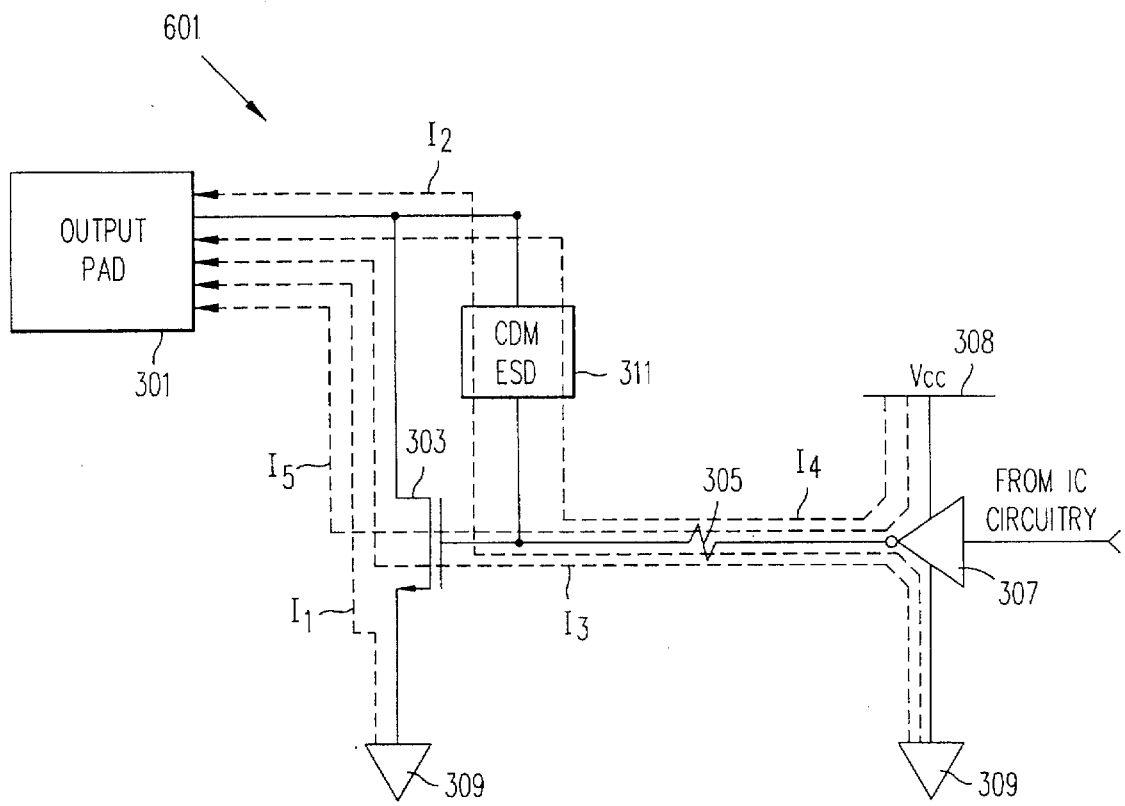

For example, FIGS. 6a and 6b illustrate output circuits 600 and 601, respectively. Output circuit 600 includes a pull-up driver circuit, and output circuit 601 includes a pull-down driver circuit. Output circuit 600 (FIG. 6a) is formed by taking the upper half of output circuit 300 (FIG. 3a). In output circuit 600, during a CDM ESD event across $V_{CC}$ supply rail 308 and output pad 301, CDM ESD protection circuit 310 provides a relatively low impedance path between the gate of transistor 302 and output pad 301, such that most, if not all, CDM ESD current is discharged along current paths $I_1$ and $I_2$, and little to no CDM ESD current is discharged along current path 13. During a CDM ESD event across ground supply rail 309 and output pad 301, CDM ESD protection circuit 310 again provides a relatively low impedance path between the gate of transistor 302 and output pad 301, such that most CDM ESD current is discharged along current path $I_4$, and little to no CDM ESD current is discharged along current path $I_5$.

Output circuit 601 (FIG. 6b) is formed by taking the lower half of output circuit 300 (FIG. 3). CDM ESD protection circuit 311 provides a relatively low impedance path between the gate of transistor 303 and output pad 301 during CDM ESD events. Thus, during a CDM ESD event across ground supply rail 309 and output pad 301, CDM ESD current is discharged along current paths $I_1$ and $I_2$, and to a much lesser extent (if at all) along current path $I_3$. During a CDM ESD event across $V_{CC}$ supply rail 308 and output pad 301, CDM ESD current is discharged along current path $I_4$, and to a much lesser extent (if at all) along current path $I_5$.

Output circuits 400 (FIG. 4) and 500 (FIG. 5) can be split in half in the same manner as output circuit 300 to provide additional output circuits in accordance with the invention.

Figure 7A:
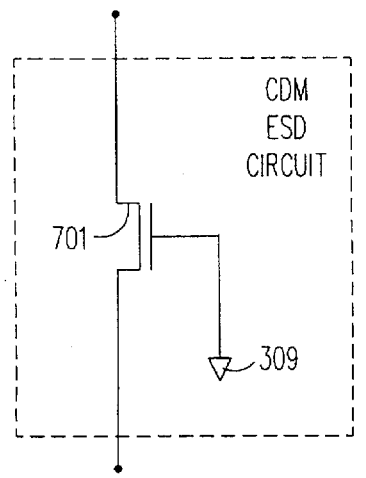
FIGS. 7a and 7b are schematic diagrams of CDM ESD protection circuits in accordance with alternative embodiments of the invention.
Figure 7B:
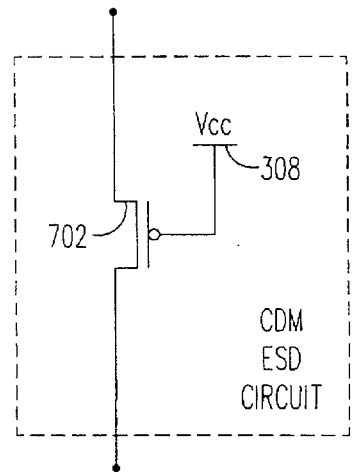

FIGS. 7a and 7b are schematic diagrams of two possible CDM ESD protection circuits which can be used in output circuits 300, 400, 500, 600 and 601. FIG. 7a illustrates a n-channel field effect transistor 701 having a gate connected to ground supply rail 309. FIG. 7b illustrates a p-channel field effect transistor 702 having a gate connected to $V_{CC}$ voltage supply rail 308. Transistor 701 (or transistor 702) conducts current between its source and drain when a voltage difference across the source and drain of the transistor exceeds the breakdown or punch-through voltage of the transistor, typically about 11 volts. Thus, transistors 701 and 702 operate in breakdown or punch-through mode to conduct charge when high voltages are applied across these transistors during a CDM ESD event. The CDM ESD protection circuits are designed to conduct significant amounts of current only when high ESD voltages are present. The CDM ESD protection circuits are also designed such that these circuits do not turn on or conduct any significant leakage currents when normal operating voltages are applied to these circuits. Although two particular CDM ESD protection circuits are shown in FIGS. 7a and 7b, other circuits are possible. For example, bipolar transistors or diodes could be used by one skilled in the art to provide the functionality required for the CDM ESD protection circuits.

Although the invention has been described in connection with several embodiments, it is understood that this invention is not limited to the embodiments disclosed, but is capable of various modifications which would be apparent to a person skilled in the art. For example, the specific conductivity types presented in the described embodiments can be reversed to achieve similar results. Thus, the invention is limited only by the following claims.

I claim:

1. An output circuit for an integrated circuit comprising:
   an output pad;
   a first voltage supply rail for receiving a first voltage during normal operation of the integrated circuit;
   a second voltage supply rail for receiving a second voltage during normal operation of the integrated circuit, wherein the first voltage is greater than the second voltage;
   a first field effect transistor connected between the first voltage supply rail and the output pad;
   a first driving circuit connected to a gate of the first transistor, wherein the first driving circuit is connected across the first and second voltage supply rails; and
   a first protection circuit connected between the gate of the first transistor and the output pad, the first protection circuit comprising a second field effect transistor having a gate coupled to the second voltage supply rail.

2. The output circuit of claim 1, further comprising a second protection circuit connected between the gate of the first transistor and the output pad, wherein the second protection circuit is connected in parallel with the first protection circuit, the second protection circuit comprising a third field effect transistor having a gate electrode coupled to the second voltage supply rail.

3. The output circuit of claim 1, wherein the first protection circuit comprises an n-channel field effect transistor.

4. The output circuit of claim 1, wherein the first transistor comprises an n-channel field effect transistor.

5. The output circuit of claim 1, wherein the first voltage is a positive voltage and the second voltage is a ground voltage.

6. The output circuit of claim 1, further comprising a first resistor connected between the first driving circuit and the gate of the first transistor.

7. The output circuit of claim 6, wherein the first resistor is connected between the gate of the first transistor and the first protection circuit.

8. The output circuit of claim 6, wherein the first resistor is connected between the first protection circuit and the first driving circuit.

9. The output circuit of claim 1, further comprising:
   a third field effect transistor connected between the second voltage supply rail and the output pad;
   a second driving circuit connected to a gate of the third transistor, wherein the second driving circuit is connected across the first and second voltage supply rails; and
   a second protection circuit connected between the gate of the third transistor and the output pad, the second protection circuit comprising a fourth field effect transistor having a gate coupled to the second voltage supply rail.

10. The output circuit of claim 9, further comprising:
    a third protection circuit connected between the gate of the first transistor and the output pad, wherein the third protection circuit is connected in parallel with the first protection circuit; and
    a fourth protection circuit connected between the gate of the second transistor and the output pad, wherein the fourth protection circuit is connected in parallel with the second protection circuit.

11. The output circuit of claim 10, wherein the third and fourth protection circuits each comprise a field effect transistor having a gate connected to the second voltage supply rail.

12. The output circuit of claim 9, further comprising:
    a first resistor connected between the first driving circuit and the gate of the first transistor; and
    a second resistor connected between the second driving circuit and the gate of the third transistor.

13. The output circuit of claim 12, wherein the first resistor is connected between the gate of the first transistor and the first protection circuit, and the second resistor is connected between the gate of the third transistor and the second protection circuit.

14. The output circuit of claim 12, wherein the first resistor is connected between the first protection circuit and the first driving circuit, and the second resistor is connected between the second protection circuit and the second driving circuit.

15. An output circuit for an integrated circuit comprising:
    an output pad;
    a first voltage supply rail for receiving a first voltage during normal operation of the integrated circuit;
    a second voltage supply rail for receiving a second voltage during normal operation of the integrated circuit;
    a first field effect transistor connected between the first voltage supply rail and the output pad, the first transistor having a gate oxide layer;
    a first driving circuit connected to a gate of the first transistor, wherein the first driving circuit is connected across the first and second voltage supply rails; and
    first protection means for routing electrostatic discharge current from the first and second voltage supply rails to the output pad, the first protection means being connected between the gate of the first transistor and the output pad, wherein the first protection means conducts electrostatic discharge current from the first and second voltage supply rails to the output pad, thereby preventing substantial electrostatic discharge current from flowing through the gate oxide layer of the first transistor.

16. The output circuit of claim 15, wherein the first protection means comprises an n-channel transistor having a gate coupled to the second voltage supply.

17. The output circuit of claim 15, wherein the first protection means comprises a p-channel transistor having a gate coupled to the first voltage supply.

18. The output circuit of claim 15, further comprising:

a second field effect transistor connected between the second voltage supply rail and the output pad, the second transistor having a gate oxide layer;

a second driving circuit connected to a gate of the second transistor, wherein the second driving circuit is connected across the first and second voltage supply rails; and second protection means for routing electrostatic discharge current from the first and second voltage supply rails to the output pad, the second protection means being connected between the gate of the second transistor and the output pad, wherein the second protection means conducts electrostatic discharge current from the first and second voltage supply rails to the output pad, thereby preventing substantial electrostatic discharge current from flowing through the gate oxide layer of the second transistor.

19. The output circuit of claim 18, wherein the second protection means comprises an n-channel transistor having a gate coupled to the second voltage supply.

20. The output circuit of claim 18, wherein the second protection means comprises a p-channel transistor having a gate coupled to the first voltage supply.

21. A method of protecting the gate oxide of a first transistor coupled between a first voltage supply rail and an output pad of an integrated circuit, wherein a gate of the first transistor is coupled to a first driver circuit which is coupled to the first voltage supply rail and a second voltage supply rail, the method comprising the steps of:

providing a first protection circuit between the gate of the first transistor and the output pad;

routing current from the first supply rail to the output pad through the first protection circuit when excessive charge is present at the first supply rail, thereby preventing substantial current from flowing through the gate oxide of the first transistor; and routing current from the second supply rail to the output pad through the first protection circuit when excessive charge is present at the second supply rail, thereby preventing substantial current from flowing through the gate oxide of the first transistor.

22. The method of claim 19, wherein the method further comprises protecting the gate oxide of a second transistor coupled between the second voltage supply rail and the output pad, wherein a gate of the second transistor is coupled to a second driver circuit which is coupled to the first voltage supply rail and the second voltage supply rail, the method further comprising the steps of:

providing a second protection circuit between the gate of the second transistor and the output pad;

routing current from the first supply rail to the output pad through the second protection circuit when excessive charge is present at the first supply rail, thereby preventing substantial current from flowing through the gate oxide of the second transistor; and routing current from the second supply rail to the output pad through the second protection circuit when excessive charge is present at the second supply rail, thereby preventing substantial current from flowing through the gate oxide of the second transistor.

23. An output circuit for an integrated circuit comprising:

an output pad;

a first voltage supply rail for receiving a first voltage during normal operation of the integrated circuit;

a second voltage supply rail for receiving a second voltage during normal operation of the integrated circuit, wherein the first voltage is greater than the second voltage;

a first field effect transistor connected between the second voltage supply rail and the output pad;

a first driving circuit connected to a gate of the first transistor, wherein the first driving circuit is connected across the first and second voltage supply rails; and a first protection circuit connected between the gate of the first transistor and the output pad, the first protection circuit comprising a second field effect transistor having a gate coupled to the second voltage supply rail.

24. The output circuit of claim 23, wherein the first and second transistors are n-channel transistors.

25. An output circuit for an integrated circuit comprising:

an output pad;

a first voltage supply rail for receiving a first voltage during normal operation of the integrated circuit;

a second voltage supply rail for receiving a second voltage during normal operation of the integrated circuit, wherein the first voltage is greater than the second voltage;

a first field effect transistor connected between the first voltage supply rail and the output pad;

a first driving circuit connected to a gate of the first transistor, wherein the first driving circuit is connected across the first and second voltage supply rails; and a first protection circuit connected between the gate of the first transistor and the output pad, the first protection circuit comprising a second field effect transistor having a gate coupled to the first voltage supply rail.

26. The output circuit of claim 25, wherein the first transistor is an n-channel transistor and the second transistor is a p-channel transistor.

* * * * *